(12) United States Patent
Dankers et al.

(10) Patent No.: US 11,662,489 B2
(45) Date of Patent: May 30, 2023

(54) METHOD OF MAKING AN ACOUSTIC SENSOR

(71) Applicant: Hifi Engineering Inc., Calgary (CA)

(72) Inventors: Arne Dankers, Calgary (CA); Seyed Ehsan Jalilian, Calgary (CA)

(73) Assignee: HIFI ENGINEERING INC., Calgary (CA)

(*) Notice: Subject to any disclaimer, the term of this patent is extended or adjusted under 35 U.S.C. 154(b) by 612 days.

(21) Appl. No.: 16/607,924

(22) PCT Filed: Apr. 25, 2018

(86) PCT No.: PCT/CA2018/050486
§ 371 (c)(1),
(2) Date: Oct. 24, 2019

(87) PCT Pub. No.: WO2018/195661
PCT Pub. Date: Nov. 1, 2018

(65) Prior Publication Data
US 2020/0096658 A1    Mar. 26, 2020

Related U.S. Application Data

(60) Provisional application No. 62/490,422, filed on Apr. 26, 2017.

(51) Int. Cl.
| | | |
|---|---|---|
| G01V 1/18 | (2006.01) | |
| G01H 9/00 | (2006.01) | |
| G01V 1/40 | (2006.01) | |
| G01V 1/20 | (2006.01) | |
| H05K 1/02 | (2006.01) | |

(52) U.S. Cl.
CPC ............... G01V 1/18 (2013.01); G01H 9/004 (2013.01); G01V 1/20 (2013.01); G01V 1/40 (2013.01); H05K 1/0274 (2013.01)

(58) Field of Classification Search
CPC ... G01V 1/18; G01V 1/20; G01V 1/40; G01H 9/004; H05K 1/0274
See application file for complete search history.

(56) References Cited

U.S. PATENT DOCUMENTS

| | | | | |
|---|---|---|---|---|
| 4,893,930 | A | * | 1/1990 | Garrett ................... G01H 9/004 356/477 |
| 5,329,349 | A | * | 7/1994 | Patterson ............. G01C 19/722 356/73.1 |
| 5,825,489 | A | | 10/1998 | Lagakos et al. |
| 6,040,908 | A | * | 3/2000 | Rahn ..................... G01C 19/722 356/465 |

(Continued)

FOREIGN PATENT DOCUMENTS

WO    2016205955 A1    12/2016

*Primary Examiner* — Isam A Alsomiri
*Assistant Examiner* — Joseph C Fritchman
(74) *Attorney, Agent, or Firm* — D'Ambrosio & Menon, PLLC; Usha Menon

(57) ABSTRACT

There is described a method of making an acoustic sensor having a frequency response approximating a desired frequency response. The method comprises wrapping optical fiber around a core according to a wrapping pattern. The wrapping pattern is determined from an impulse response of the acoustic sensor. The impulse response is determined from the desired frequency response of the acoustic sensor.

19 Claims, 22 Drawing Sheets

(56) References Cited

U.S. PATENT DOCUMENTS

| | | |
|---|---|---|
| 6,269,198 B1 | 7/2001 | Hodgson et al. |
| 2003/0230664 A1* | 12/2003 | Healy .................. G01C 19/722 |
| | | 242/445 |
| 2018/0164151 A1* | 6/2018 | Dankers ............. G01D 5/35374 |

* cited by examiner

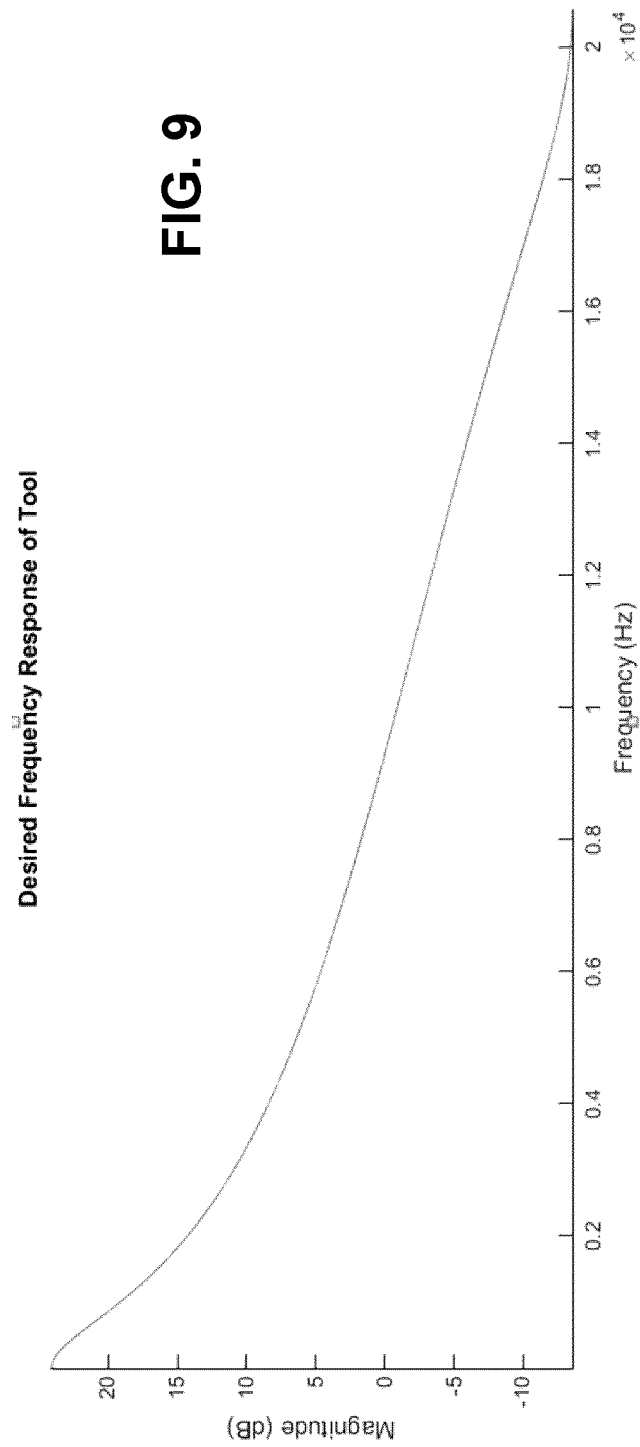

METHOD OF MAKING AN ACOUSTIC SENSOR

FIELD OF THE DISCLOSURE

The present disclosure relates to the field of fiber optic acoustic sensors and, more particularly, to shaping a frequency response for fiber optic acoustic sensors.

BACKGROUND TO THE DISCLOSURE

Fiber optic cables are often used for distributed measurement systems in acoustic sensing applications. Acoustic sensors may be formed by wrapping a segment of fiber optic cable around a core. The length of cable wrapped around the core affects the sensitivity of the sensor.

Pressure changes, due to sound waves for example, in the space immediately surrounding an optical fiber and that encounter the optical fiber, cause dynamic strain in the optical fiber. Optical interferometry may be used to detect the dynamic strain along a segment of the fiber. Optical interferometry is a technique in which two separate light pulses, a sensing pulse and a reference pulse, are generated and interfere with each other. The sensing and reference pulses may, for example, be directed along an optical fiber that comprises fiber Bragg gratings on either side of the core around which the optical fiber wraps. The fiber Bragg gratings partially reflect the pulses back towards an optical receiver at which an interference pattern is observed.

The nature of the interference pattern observed at the optical receiver provides information on the optical path length the pulses traveled, which in turn provides information on parameters such as the strain experienced by the segment of optical fiber between the fiber Bragg gratings. Information on the strain then provides information about the event that caused the strain.

There exists a continued desire to advance and improve technology used in fiber optic acoustic sensors.

SUMMARY OF THE DISCLOSURE

In a first aspect of the disclosure, there is provided a method of making an acoustic sensor having a frequency response approximating a desired frequency response. The method comprises wrapping optical fiber around a core according to a wrapping pattern. The wrapping pattern is determined from an impulse response of the acoustic sensor. The impulse response is determined from the desired frequency response of the acoustic sensor.

The impulse response may be determined by applying an inverse Fourier transform to the desired frequency response.

In some embodiments, $$A(f) = \left| \mathcal{F}\left[ rect\left(\frac{v}{d}u\right) w\left(vu + \frac{d}{2}\right) \right] \right|,$$

wherein: A(f) is the desired frequency response; F( ) is the Fourier transform function; recto is a function equal to 1 for all values in the range [-0.5; 0.5], and equal to 0 otherwise; v is the speed of sound; u=(x/v)−(d/2v), x is a distance along the core; d is a length of the core; and w( ) is the wrapping pattern as a function of x.

The wrapping pattern may define an amount of optical fiber to be wrapped around the core as a function of position along the core. The amount of optical fiber may comprise a number of layers of optical fiber. An amount of optical fiber to be wrapped around the core may vary in accordance with a magnitude of the coefficients of the impulse response.

A shape of the wrapping pattern may match a shape of the impulse response.

The impulse response is related to the inverse Fourier transform of the desired frequency response. The magnitude of the coefficients of the impulse response can be used to determine the wrapping pattern. In particular, the magnitude of the coefficients of the impulse response can be used to determine the number of wraps or layers of optical fiber around the core, as a function of position along the core.

The wrapping pattern may be symmetric about a midpoint of the core.

The impulse response may comprise one or more positive portions (with positive coefficients) and one or more negative portions (with negative coefficients). Wrapping optical fiber around the core may comprise wrapping a first optical fiber around the core according to the one or more positive portions. Wrapping optical fiber around the core may further comprise wrapping a second optical fiber around the core according to the one or more negative portions.

The method may further comprise measuring an output of the acoustic sensor. Measuring the output may comprise subtracting an output of the second optical fiber from an output of the first optical fiber.

A width of the core may vary in accordance with a height of the wrapping pattern. The width may vary in one or more steps. Each step may have a height equal to a width of the optical fiber.

In a further aspect of the disclosure, there is provided an acoustic sensor made according to any of the methods described herein.

According to a further aspect of the disclosure, there is provided an acoustic sensing system. The system comprises a pipeline or a wellbore. The system further comprises one or more acoustic sensors positioned in acoustic proximity to the pipeline or the wellbore. The one or more acoustic sensors are made according to any of the methods described herein.

According to a further aspect of the disclosure, there is provided a method of making an acoustic sensor having a frequency response approximating a desired frequency response. The method comprises determining an impulse response of the acoustic sensor from the desired frequency response. The method further comprises determining a wrapping pattern from the impulse response. The wrapping pattern may define a pattern according to which optical fiber is to be wrapped around a core.

The method may further comprise wrapping optical fiber around a core according to the wrapping pattern.

According to a further aspect of the disclosure, there is provided a computer-readable medium having encoded thereon program code configured to cause a computer to execute any of the methods described herein.

BRIEF DESCRIPTION OF THE DRAWINGS

Specific embodiments of the disclosure will now be described in conjunction with the accompanying drawings, of which:

FIG. 9 is a frequency response of a first-order low-pass filter;

DETAILED DESCRIPTION OF SPECIFIC EMBODIMENTS

The present disclosure seeks to provide a method of making an acoustic sensor. While various embodiments of the disclosure are described below, the disclosure is not limited to these embodiments, and variations of these embodiments may well fall within the scope of the disclosure which is to be limited only by the appended claims.

Fiber optic acoustic sensors may be made by wrapping a length of optical fiber around a core. Pressure changes, for example, pressure changes caused by an event such as a sound wave, may be detected along the length of the sensor, resulting in a distributed measurement. As appreciated by the present inventors, and as will be described in more detail below, the frequency response of the sensor is determined by the wrapping pattern of the optical fiber around the core, and may be shaped by modifying the wrapping pattern. Selecting a suitable wrapping pattern may therefore allow a sensor to be tuned to particular frequency bands of interest.

Figure 1A:
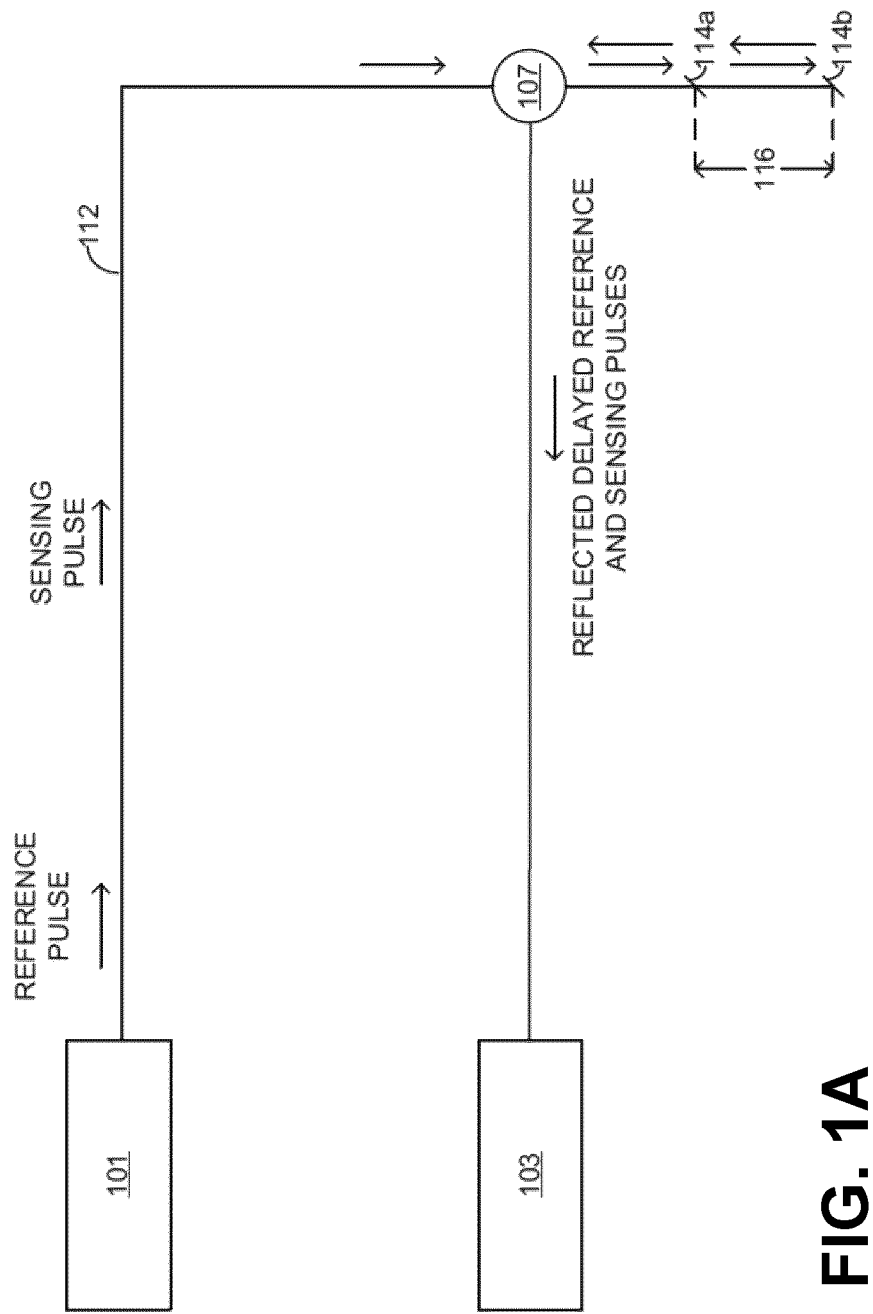
FIG. 1A is a schematic of an optical interferometry system for acoustic applications.

FIG. 1A is a block diagram of an embodiment of a system that uses optical interferometry for fiber optic sensing applications. Optical interferometry is a technique in which two separate light pulses are generated: a sensing pulse and a reference pulse. These pulses may be generated by an optical source such as a laser. When optical interferometry is used for fiber optic sensing applications, the sensing and reference pulses are at least partially reflected back towards an optical receiver.

Accordingly, in FIG. 1A, an optical source 101 emits a sensing light pulse and a delayed reference pulse into an optical fiber 112 that comprises a first pair of fiber Bragg gratings ("FBGs"), via an optical circulator 107. The first pair of FBGs comprises first and second FBGs 114a,b (generally, "FBGs 114"). The first and second FBGs 114a,b are separated by a fiber segment 116 of optical fiber 112. The light pulse has a wavelength identical or very close to the center wavelength of FBGs 114, which is the wavelength of light FBGs 114 are designed to partially reflect. The sensing and delayed reference pulses are accordingly each partially reflected by FBGs 114a,b and return to optical circulator 107 which directs them to an optical receiver 103. The delay time between the reference pulse and the sensing pulse is such that the delayed reference pulse that reflects off first FBG 114a (hereinafter the "reflected, delayed reference pulse") arrives at optical receiver 103 simultaneously with the sensing pulse that reflects off second FBG 114b (hereinafter the "reflected sensing pulse"), which permits optical interference to occur. While FBGs 114 are used as partial reflectors of light pulses in the depicted embodiment, in alternative embodiments (not depicted) different types of partial reflectors may be used.

Figure 1B:
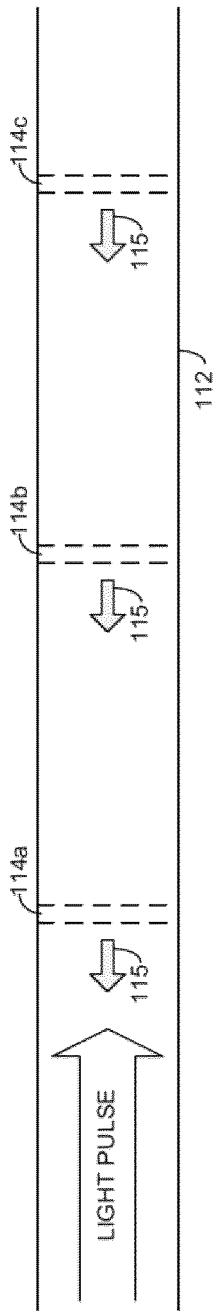
FIG. 1B depicts how fiber Bragg gratings reflect a light pulse.

FIG. 1B depicts how FBGs 114 reflect the light pulse, according to another embodiment in which optical fiber 112 comprises a third FBG 114c. In FIG. 1B, second FBG 114b is equidistant from each of first and third FBGs 114a,c when fiber 112 is not strained. The light pulse propagates along fiber 112 and encounters three different FBGs 114, with each of FBGs 114 reflecting a portion 115 of the pulse back towards the optical receiver 103. In embodiments comprising three or more FBGs 114, the portions of the sensing and delayed reference pulses not reflected by first and second FBGs 114a,b can reflect off third FBG 114c and any subsequent FBGs 114, resulting in interferometry that can be used to detect strain along fiber 112 occurring further from optical source 101 than second FBG 114b. For example, in the embodiment of FIG. 1B, a portion of the sensing pulse not reflected by first and second FBGs 114a,b can reflect off third FBG 114c, and a portion of the delayed reference pulse not reflected by first FBG 114a can reflect off second FBG 114b, and these reflected pulses can interfere with each other at optical receiver 103.

Any changes to the optical path length of fiber segment 116 result in a corresponding phase difference between the reflected, delayed reference pulse and the reflected sensing pulse received at optical receiver 103. Since the two reflected pulses are received as one combined interference pulse, the phase difference between them is embedded in the combined signal. This phase information can be extracted using proper signal processing techniques, such as phase demodulation. The relationship between the optical path of the fiber segment and that phase difference ($\theta$) is as follows:

$$\theta = 2\pi nL/\lambda$$

where n is the index of refraction of the optical fiber, L is the physical path length of the fiber segment, and $\lambda$ is the wavelength of the optical pulses. A change in nL is caused by the fiber experiencing longitudinal strain induced by energy being transferred into the fiber. The source of this energy may be, for example, an object outside of the fiber experiencing dynamic strain, undergoing vibration, or emitting energy. As used herein, "dynamic strain" refers to strain that changes over time.

Figure 1C:
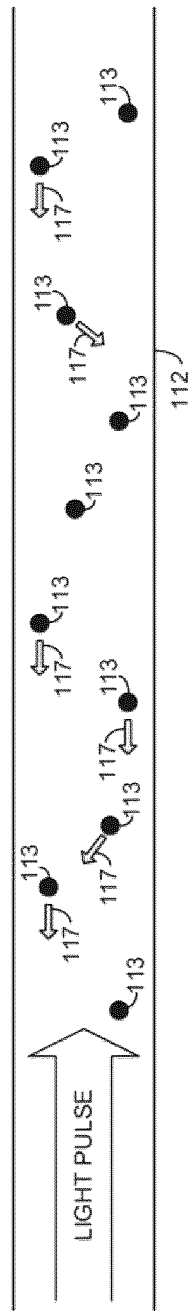
FIG. 1C is a schematic representation of Rayleigh scattering in an optical fiber.

Referring to FIG. 1C, one conventional way of determining AnL is by using what is broadly referred to as distributed acoustic sensing ("DAS"). DAS involves laying the fiber through or near a region of interest and then sending a coherent laser pulse along the fiber. As shown in FIG. 1C, the laser pulse interacts with impurities 113 in fiber 112, which results in scattered laser light 117 because of Rayleigh scattering. Vibration or acoustics emanating from the region of interest results in a certain length of fiber 112 becoming strained, and the optical path change along that length varies directly with the magnitude of that strain. Some of scattered laser light 117 is back scattered along fiber 112 and is directed towards an optical receiver (not shown). Depending on the amount of time required for scattered light 117 to reach the receiver and the phase of scattered light 117 as determined at the receiver, the location and magnitude of the vibration or acoustics can be estimated with respect to time. DAS relies on interferometry using the reflected light to estimate the strain experienced by the fiber. The amount of light that is reflected is relatively low because it is a subset of scattered light 117. Consequently, and as evidenced by comparing FIGS. 1B and 1C, Rayleigh scattering transmits significantly less light back towards the optical receiver than using FBGs 114. DAS accordingly uses Rayleigh scattering to estimate the magnitude, with respect to time, of the strain experienced by the fiber during an interrogation time window, which is a proxy for the magnitude of the vibration or acoustics emanating from the region of interest. In certain embodiments, the sensor system is configured to utilize DAS.

In certain embodiments, the sensor system may be configured to measure dynamic strain by using interferometry resulting from laser light reflected by FBGs 114 that are added to fiber 112 and that are designed to reflect significantly more of the light than is reflected as a result of Rayleigh scattering. This contrasts with an alternative use of FBGs 114 in which the center wavelengths of FBGs 114 are monitored to detect any changes that may result to it in response to strain.

Figure 2:
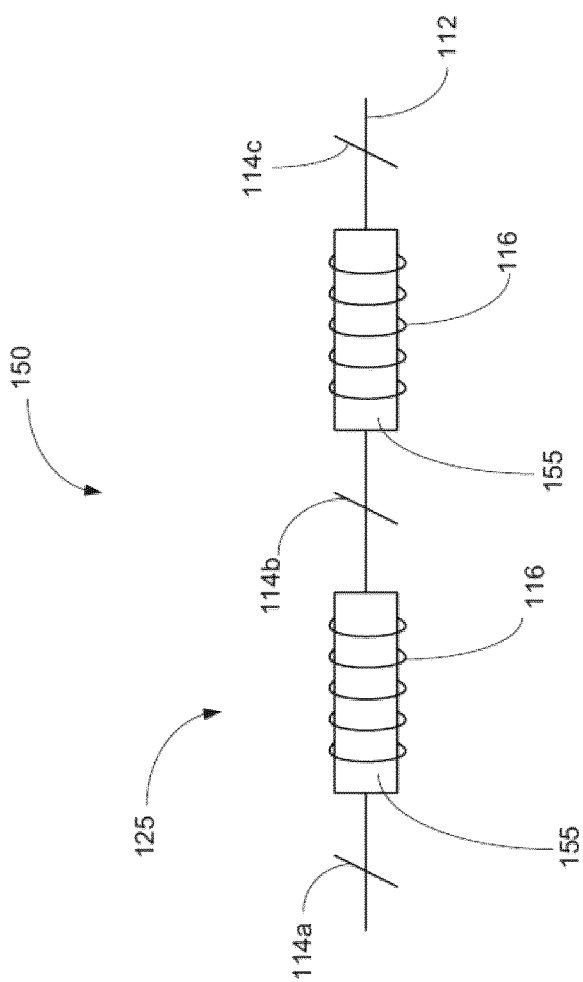
FIG. 2 shows an embodiment of a fiber-wrapped acoustic sensor.

Referring to FIG. 2, an acoustic sensor array 150 comprises a plurality of FBGs 114a, 114b, 114c etched in an optical fiber 112. FBGs 114a, 114b, 114c are separated by fiber segments 116. Each of fiber segments 116 is wound about a core or a mandrel 155 to form a wrap. A sensor (e.g. sensor 125) comprises a pair of FBGs (e.g. FBGs 114a and 114b) and a mandrel (e.g. mandrel 155) between the pair of FBGs with a fiber segment 116 wound around it. The length of sensor 125 is the distance between the pair of FBGs 114a and 114b. In this embodiment, sensor array 150 uses three FBGs 114 to form two sensors. Alternatively, in other embodiments (not depicted), a pair of FBGs 114 may be exclusive to a single sensor 125 so that two sensors 125 are formed using four FBGs 114 with an intervening length of optical fiber between the two sensors. A sensor array may comprise any number of sensors 125 suitable for a particular application, and multiple sensor arrays may be included on optical fiber 112. Examples of prior art acoustic sensor arrays include the MiQro™ tool manufactured by Hifi Engineering Inc. of Calgary, Alberta.

The spacing of sensors 125 may be anywhere in a range between about 0.1 to about 25 meters. In some embodiments, the spacing may be about, for example, 38 cm. Mandrel 155 may have any suitable length and diameter. For example, in some embodiments, mandrel 155 is about 25 cm long and is generally cylindrical. The diameter of mandrel 155 may be sized for particular applications. For example, for a regular tool with an outer diameter of about 2.125" (about 5.4 cm), mandrel 155 may have an outer diameter of about 1.125" (about 2.858 cm). For a slim hole tool with an outer diameter of about 1.6875" (about 4.2863 cm), mandrel 155 may have an outer diameter of about 0.5625" (about 1.4288 cm). In certain embodiments, at least one of the diameter and length of mandrel 155 may be increased to accommodate a greater intervening length of optical fiber 112.

Optical fibers used as acoustic sensors generally comprise one or more fiber optic strands, each of which is made from quartz glass (amorphous $SiO_2$). The fiber optic strands are doped with various elements and compounds (including germanium, praseodymium, erbium oxides, and others) to alter their refractive indices, although in alternative embodiments the fiber optic strands may not be doped. Single mode and multimode optical strands of fiber are commercially available from, for example, Corning® Optical Fiber. Example optical fibers include ClearCurve™ fibers (bend-insensitive), SMF28 series single mode fibers such as SMF-28 ULL fiber or SMF-28e fiber, and InfiniCor® series multimode fibers.

Mandrel 155 may be comprised of any suitable material or combination of materials that cooperate to provide the desired effect; examples include metals, rubbers of various durometer, elastomers, silicones or other polymers, or the like. In other embodiments, mandrel 155 may comprise a hollow shell filled with a fluid, an acoustic gel, or an oil, or a solid or semi-solid medium capable of transmitting or permitting passage of the relevant frequencies. The relevant frequencies may be generally in the range of 20-20,000 kHz.

Figure 3:
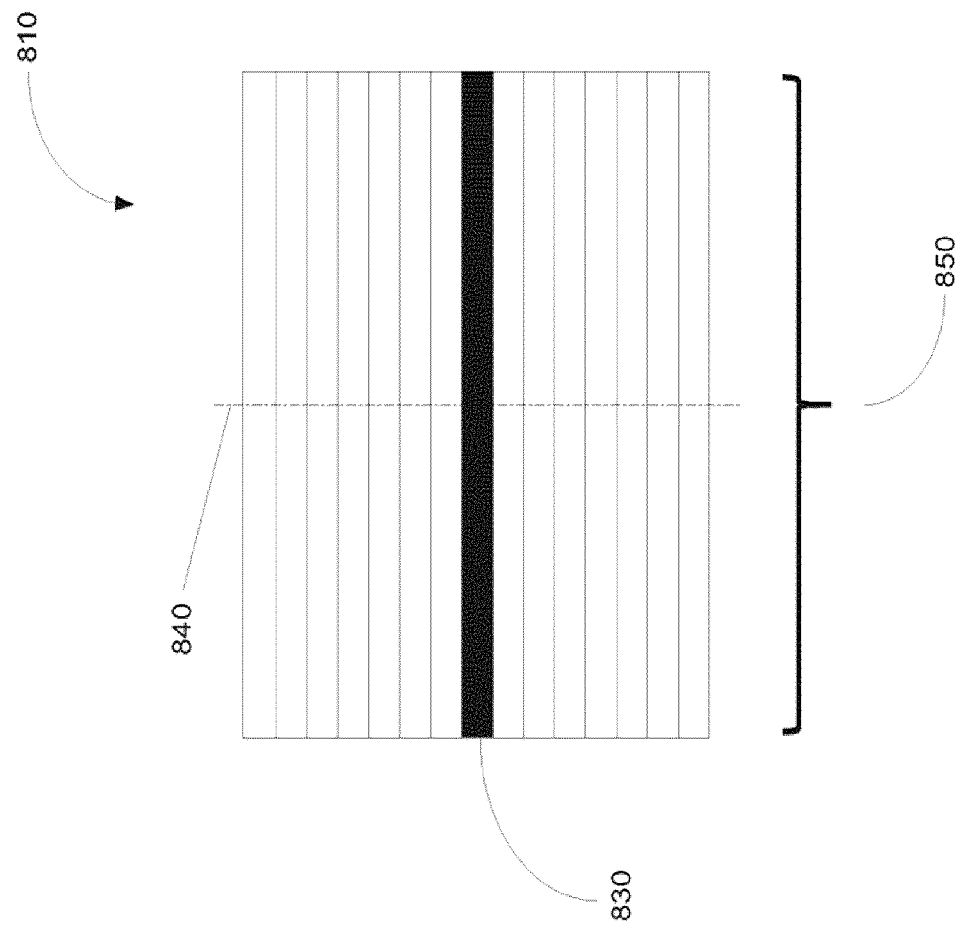
FIG. 3 is a schematic representation of a mandrel wrapped with optical fiber according to a rectangular wrapping pattern.

Wrapping or winding fiber segment 116 between a pair of FBGs 114a,b around mandrel 155 may increase the length of optical fiber sensing the signal due to the increase in effective fiber cross section axially along mandrel 155. Referring to FIG. 3, a layered wrap 810 may be formed by winding a fiber segment around a mandrel 830 in multiple layers. Layered wrap 810 has optical fiber wrapped around mandrel 830 in seven layers. In some embodiments, the number of layers formed by the optical fiber wrapping is a function of the total length of the optical fiber used and the diameter of mandrel 830. For example, wrapping 200 m of optical fiber around the mandrel 830 shown in FIG. 3 results in seven layers. The wrapping pattern of optical fiber wrapped around mandrel 830 is a standard rectangular wrapping pattern. The rectangular wrapping pattern is symmetric about a longitudinal midpoint 840 of the measurement zone 850, or about d/2, where d is the length of the measurement zone 850.

In some embodiments, the wrapping pattern may have a cross-section that is narrower at a top of the cross-section than at a base of the cross-section, wherein the base of the cross-section is adjacent the mandrel and between the mandrel and the top of the cross-section. The wrapping pattern may be symmetric or asymmetric about d/2. Examples of such wrapping patterns include, but are not limited to, triangular, ramp-shaped, and semi-circular wrapping patterns.

Figure 4:
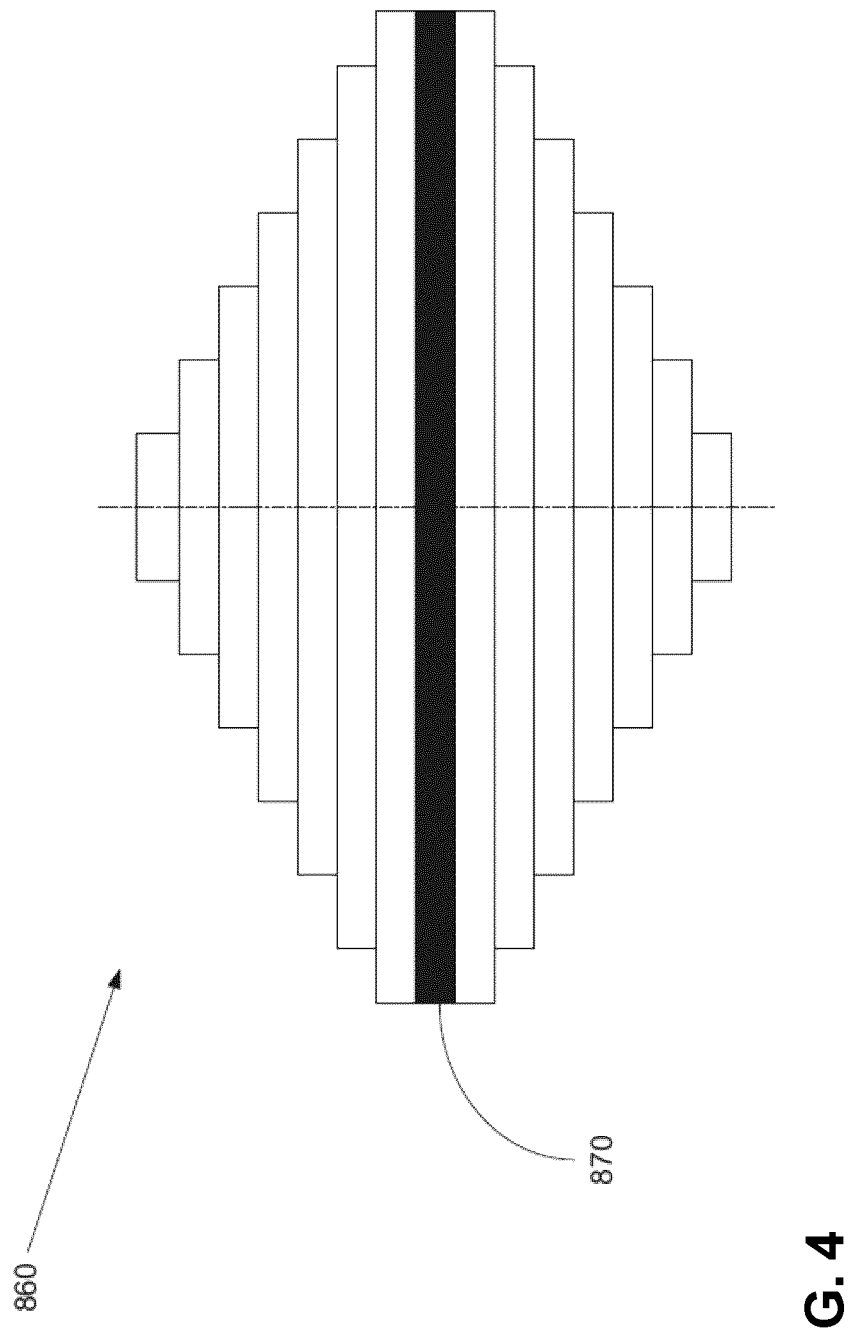
FIG. 4 is a schematic representation of a mandrel wrapped with optical fiber according to a triangular wrapping pattern.

Referring now to FIG. 4, a sensor 860 is shown that is a layered wrap with a cross-section that is approximately triangular on either side of a longitudinal axis of the mandrel 870. The approximately triangular cross-section of sensor 860 is based on a triangular wrapping pattern that is symmetric about the midpoint of a measurement zone of sensor 860, d/2. In this embodiment, the length of the measurement zone is equal to the length of mandrel 870. In this embodiment, the triangular wrapping pattern uses seven layers of optical fiber. However, in other embodiments, more or fewer layers may be used. In certain embodiments, the overhangs between adjacent layers have an equal length.

Figure 5:
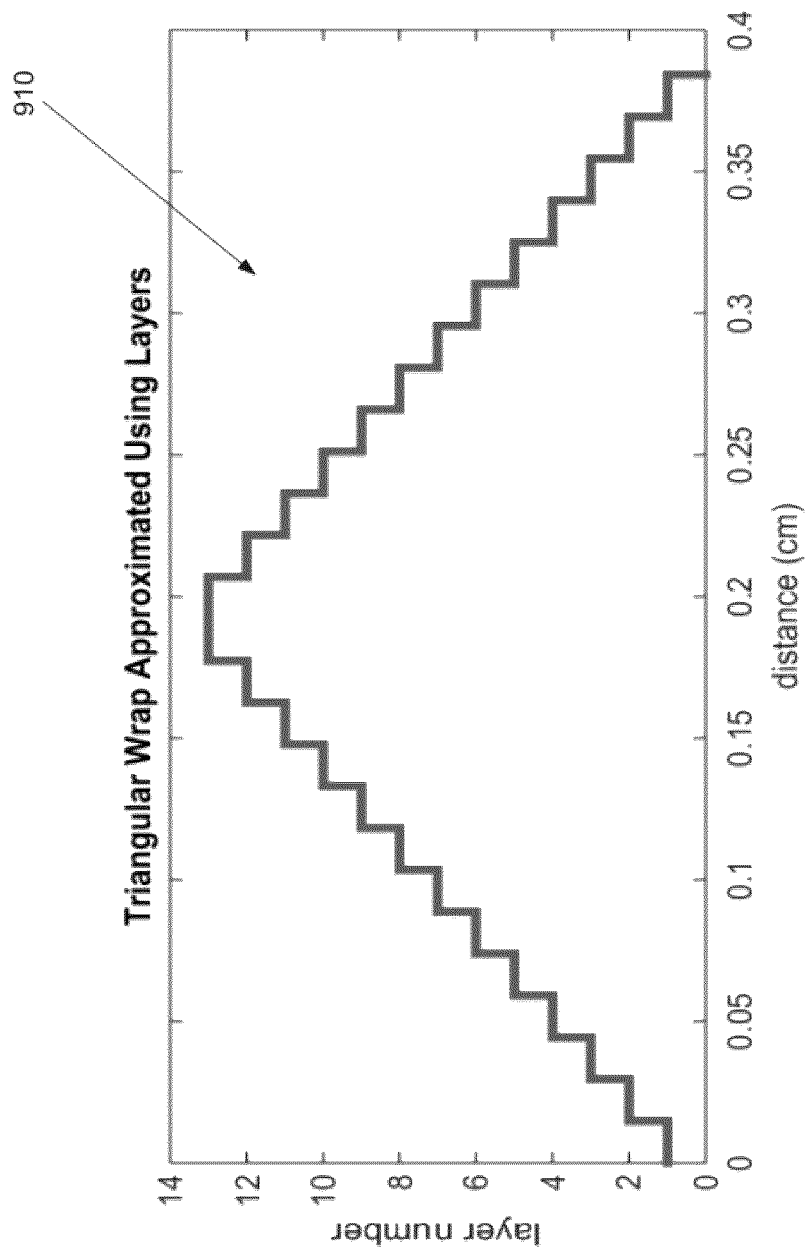
FIG. 5 is a plot of a triangular wrapping pattern.

Limitations in the physical wrapping process means that some layered wraps may, in some embodiments, be approximations of wrapping patterns, as is seen for the triangular sensor 860 shown in FIG. 4. As another example, a graph of a layered wrap 910 that approximates a triangular wrapping pattern with thirteen wrap layers is shown in FIG. 5. The wrapping pattern used for layered wrap 910 is designed to use 200 m of fiber optic cable over thirteen layers. In other embodiments, greater or shorter lengths of fiber optic cable may be used to form any suitable number of layers. As will be explained below in more detail, the height and depth of the wrap may be based on the desired frequency response, the length of fiber that is being wrapped around the mandrel, and the length of the mandrel itself.

Figure 6:
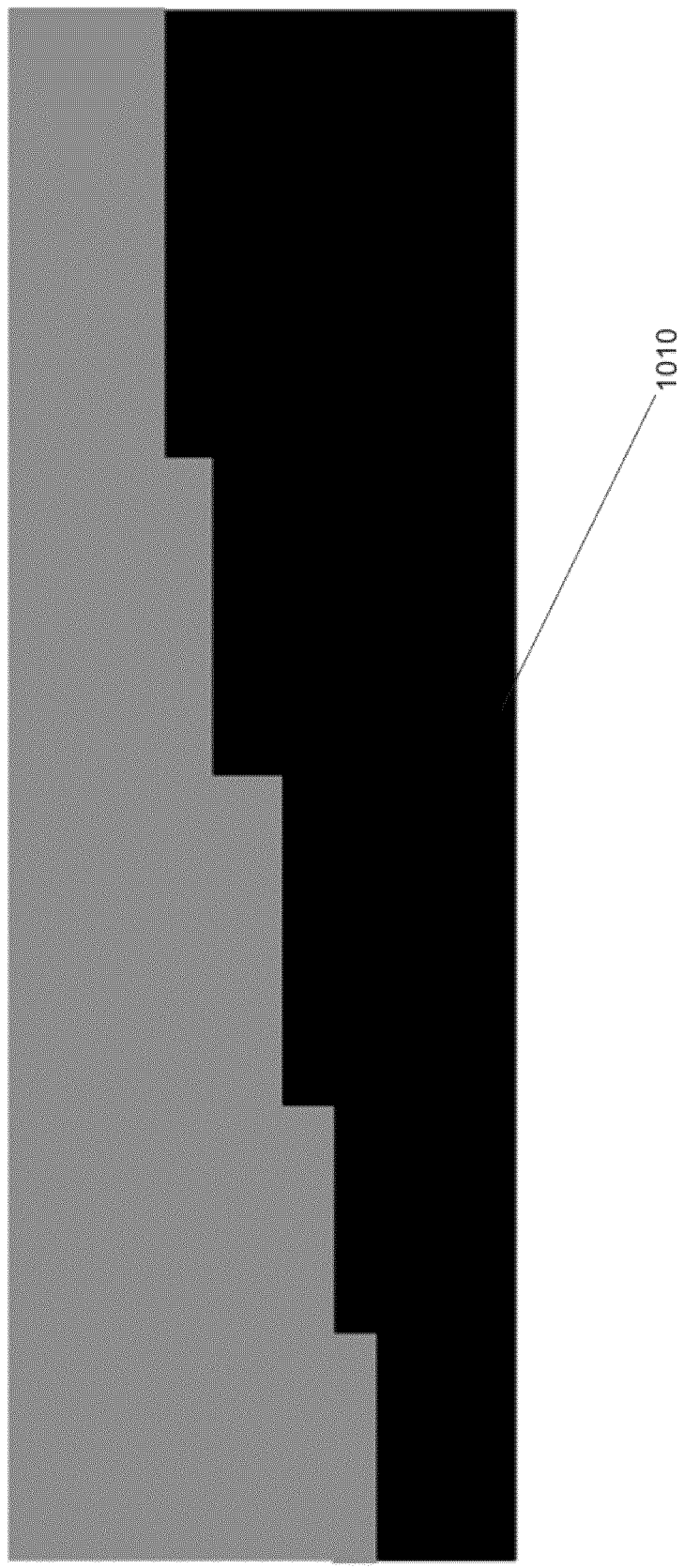
FIG. 6 is a schematic representation of a notched mandrel.

In some embodiments, a mandrel with a diameter that varies along its length may be used. For example, referring to FIG. 6, the mandrel may be a notched mandrel 1010, with the diameter of notched mandrel 1010 increasing in steps along the length of notched mandrel 1010. Optical fiber may be wound around notched mandrel 1010 to produce a combined cross-section of notched mandrel 1010 and the wrapping pattern that is rectangular through a longitudinal axis of notched mandrel 1010. A configuration using notched mandrel 1010 may be useful in applications in which a sensor with a constant diameter is desired.

Figure 7:
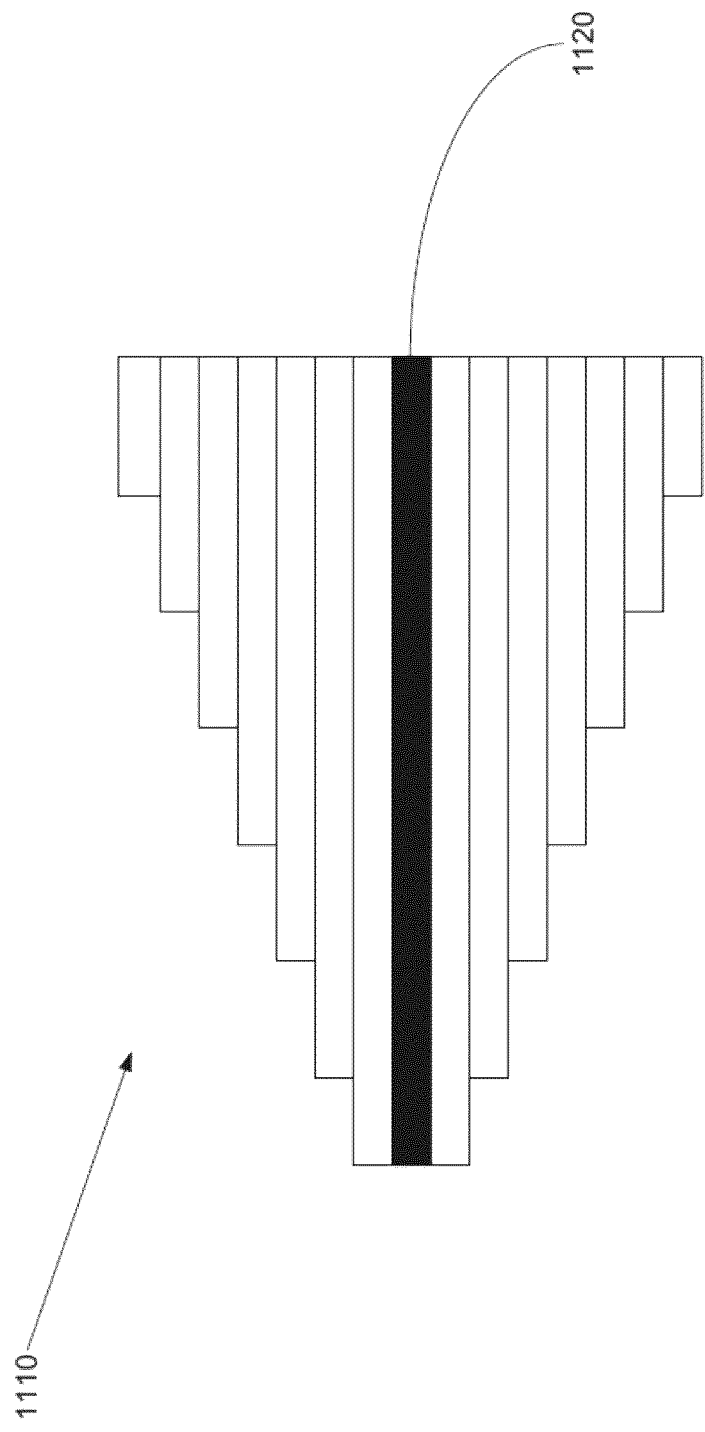
FIG. 7 is a schematic representation of a mandrel wrapped with optical fiber according to a ramp-shaped wrapping pattern.

Referring to FIG. 7, a sensor 1110 is shown with a cross-section that is approximately ramp-shaped on either side of the longitudinal axis of a mandrel 1120. The approximately ramp-shaped cross-section of sensor 1110 is based on a ramp wrapping pattern that is not symmetric about the midpoint of the length of the measurement zone, d/2. In this embodiment, the length of the measurement zone is equal to the length of mandrel 1120 and the ramp wrapping pattern uses seven layers of optical fiber. However, in other embodiments, more or fewer layers may be used.

Figure 8:
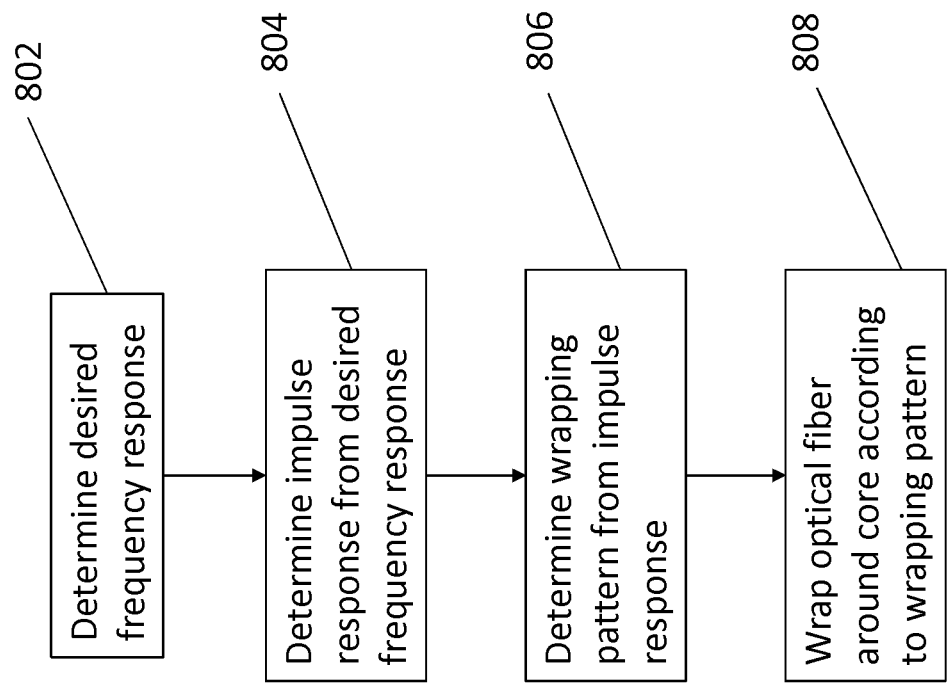
FIG. 8 is a flowchart showing a method of making an acoustic sensor, in accordance with an embodiment of the disclosure.

There will now be described a method of making an acoustic sensor having a frequency response approximating a desired frequency response, in accordance with an embodiment of the disclosure. As mentioned above, the desired frequency response of the acoustic sensor is linked to the particular wrapping pattern according to which optical fiber is wrapped around the core or mandrel. Thus, by selecting a particular frequency response and determining an associated wrapping pattern, it is possible to make an acoustic sensor exhibiting the particular frequency response by wrapping optical fiber around the core according to the associated wrapping pattern. Such a method is illustrated in FIG. 8.

At step 802, a desired frequency response of the acoustic sensor is determined. This could be for example the frequency response of a low-pass filter or a band-pass filter, examples of which are discussed in more detail below. At step 804, the impulse response of the acoustic sensor is determined from the desired frequency response. In one embodiment, determining the impulse response comprises applying an inverse Fourier transform to the desired frequency response. Once the impulse response is determined, at step 806, a wrapping pattern is determined. As will be shown below, a shape of the wrapping pattern matches a shape of the impulse response of the acoustic sensor. In particular, for a given position along the core, a height of the wrapping pattern (defining an amount of optical fiber that is to be wrapped around the core) is a function of a magnitude of a coefficient of the impulse response. At step 808, optical fiber is be wrapped around a core, such as a mandrel, in accordance with the wrapping pattern, thereby forming the acoustic sensor with the desired frequency response.

The method may be embodied in a computer-readable medium storing program code. When executed by a computer, the program code may cause a processor to perform a method of making an acoustic sensor with a desired frequency response. Starting from the desired frequency response, an impulse response of the acoustic sensor is determined. Then, a wrapping pattern is determined from the impulse response. The wrapping pattern defines a pattern according to which optical fiber is to be wrapped around a core of an acoustic sensor. Once the computer-readable medium has generated the necessary wrapping pattern, optical fiber may be wrapped around a core or mandrel in order to arrive at the desired acoustic sensor.

As will now be demonstrated, the wrapping pattern that results in an acoustic sensor with the desired frequency response is the same as the impulse response of the desired frequency response.

Let w(x) be the wrapping pattern of the acoustic sensor, where x is longitudinal distance along the core. Let d be the length of the core. Let us first consider the frequency response of an acoustic sensor, wrapped in optical fiber, to a sinusoid. The frequency response is determined by taking a sweep over all frequencies and taking the amplitude and phase of the response to a sinusoid.

The optical fiber responds to pressure changes. A sinusoid travelling over the length of the core is expressed as:

$$\sin(\omega t + kx)$$

where t is time, w is radial frequency ($\omega = 2\pi f$), and k is the wave number ($k = 2\pi/\lambda$). Because a sound wave is essentially a pressure wave travelling over the core, the pressure exerted by a sinusoid over the sensing zone $0 \leq x \leq d$ is equal to (1):

$$\int_0^d \sin(\omega t + kx) dx$$

Supposing that the core is wrapped according to wrapping pattern w(x), such that the density of optical fiber is defined by w(x), then the pressure exerted by a pressure wave of frequency f is equal to (2):

$$\int_0^d w(x) \sin(\omega t + kx) dx$$

Fourier transform pairs are used to convert between the wrapping pattern and frequency response. First, the integration limits are changed from 0 to d to −infinity to +infinity. This is achieved by using the rect( ) function where rect(x) =1 for −0.5≤x≤0.5, and 0 otherwise. Applying the rect( ) function to (2), we obtain (3):

$$\int_{-\infty}^{\infty} rect\left(\frac{x}{d} - \frac{1}{2}\right) w(x) \sin(\omega t + kx) dx$$

(3) is then expressed as a sum of complex exponentials, yielding (4):

$$\frac{1}{j2} \int_{-\infty}^{\infty} rect\left(\frac{x}{d} - \frac{1}{2}\right) w(x) \left(e^{j\omega t + jkx} - e^{-j\omega t - jkx}\right) dx$$

(4) is then expressed in the form of a Fourier Integral, with u=x/v−d/2v, and ũ=−x/v+d/2v, yielding (5):

$$\frac{v}{j2}e^{j\omega t}e^{\frac{j\omega d}{2v}}\int_{-\infty}^{\infty}rect\left(-\frac{v\tilde{u}}{d}\right)w\left(-v\tilde{u}-\frac{d}{2}\right)e^{-j2\pi f\tilde{u}}d\tilde{u} -$$

$$\frac{v}{j2}e^{-j\omega t}e^{-\frac{j\omega d}{2v}}\int_{-\infty}^{\infty}rect\left(\frac{vu}{d}\right)w\left(vu+\frac{d}{2}\right)e^{-j2\pi fu}du$$

Let f(u)=rect(vu/d)·w(vu+d/2). Then (5) may be expressed as (6):

$$\frac{v}{j2}e^{j\omega t}e^{\frac{j\omega d}{2v}}\int_{-\infty}^{\infty}f(-\tilde{u})e^{-j2\pi f\tilde{u}}d\tilde{u} - \frac{v}{j2}e^{-j\omega t}e^{-\frac{j\omega d}{2v}}\int_{-\infty}^{\infty}f(u)e^{-j2\pi fu}du =$$

$$\frac{v}{j2}e^{j\omega t}e^{\frac{j\omega d}{2v}}\mathcal{F}[f(-u)] - \frac{v}{j2}e^{-j\omega t}e^{-\frac{j\omega d}{2v}}\mathcal{F}[f(u)]$$

where F( ) is the Fourier transform with respect to u. Let F(f) denote the Fourier transform of f(u). Next, the exponential terms are gathered to obtain an expression in terms of a resized, phase-shifted sinusoid. For a real signal f(u), it holds that its Fourier transform has the following property: F(−f)= $\overline{F}$(f), where $\overline{F}$ denotes the complex conjugate of F. Denote F as a phasor:

$$F(f)=A(f)e^{j\phi(f)},$$

where A is the magnitude of F and ø is the phase of F.

Using this notation, (6) can be expressed as (7):

$$\frac{v}{j2}e^{j\omega t}e^{\frac{j\omega d}{2v}}A(f)e^{j\phi(f)} - \frac{v}{j2}e^{-j\omega t}e^{-\frac{j\omega d}{2v}}A(f)e^{-j\phi(f)} =$$

$$vA(f)\sin\left(wt+\frac{kd}{2}+\varphi(f)\right)$$

This shows that the frequency response of an acoustic sensor, wrapped with optical fiber having a density w(x), to a sinusoid of frequency f is equal to vA(f), where we obtain (8):

$$A(f) = \left|\mathcal{F}\left[rect\left(\frac{v}{d}u\right)w\left(vu+\frac{d}{2}\right)\right]\right|$$

This proves an acoustic sensor wrapped with optical fiber having a certain wrapping pattern will have a frequency response whose inverse Fourier transform will match the wrapping pattern. In other words, the shape of the wrapping pattern will match the shape of the impulse response of the acoustic sensor.

Many desired frequency responses have wrapping patterns that have one or more negative portions, as well as one or more positive portions. In order to provide a wrapping pattern which negatively weighs those portions that are negative, the present disclosure provides the following solution. The acoustic sensor is wrapped using first and second optical fibers, as will be illustrated in Examples 2 and 3 below. The first optical fiber is wrapped around the core according to the portions of the wrapping pattern that are positive. The second optical fiber is wrapped around the core according to the portions of the wrapping pattern that are negative. The total output of the acoustic sensor is determined by subtracting the output of the second optical fiber from the output of the first optical fiber. Thus, any desired wrapping pattern may be achieved by using different optical fibers for the positive and negative portions of the wrapping pattern, and subtracting one output from the other depending on which optical fiber is used for wrapping in accordance with the negative portions of the wrapping pattern.

Example 1

Consider the case of an acoustic sensor having a frequency response that approaches that of a first-order low-pass filter, as shown in FIG. 9. In order to determine the wrapping pattern that will allow the acoustic sensor to exhibit such a frequency response, the inverse Fourier transform of the first order-low-pass filter is taken.

In the present example, the desired frequency response of the first-order low-pass filter has the following form (9):

$$F(z) = \frac{1+0.6z^{-1}}{1-0.9z^{-1}},$$

where $z=e^{j\omega}$. To find the impulse response, the partial fraction expansion is obtained, and the following transform pairs (10) are then used:

$$\frac{1}{1-az^{-1}} \leftrightarrow a^k u(k)$$

$$1 \leftrightarrow \delta(k),$$

wherein u(k) is the unit step function according to which u(k) is equal to 0 for all k less than 0, and equal to 1 for all k greater than or equal to 0, and wherein δ(k) is the impulse function according to which δ(k) is equal to 0 for all k not equal to 0, and equal to 1 for k equal to 0.

The partial fraction expansion of (9) is $$F(z) = 1 + \frac{1.5}{1-0.9z^{-1}}.$$

Therefore, using the transform pairs (10), the impulse response of (9) is obtained as f(k)=δ(k)+1.5(0.9)$^k$.

In other embodiments, a Fourier conversion table may be used in order to obtain the impulse response from the desired frequency response.

Figure 10B:
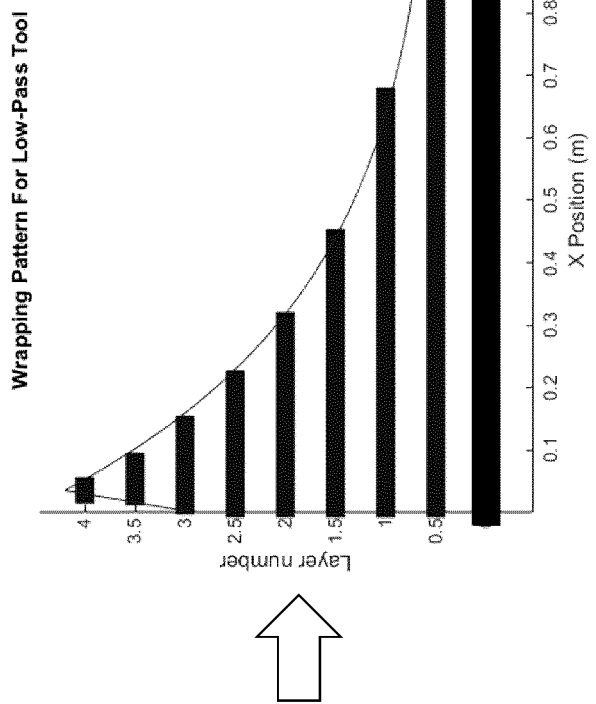
FIG. 10B is a wrapping pattern for achieving the frequency response of FIG. 9.
Figure 10A:
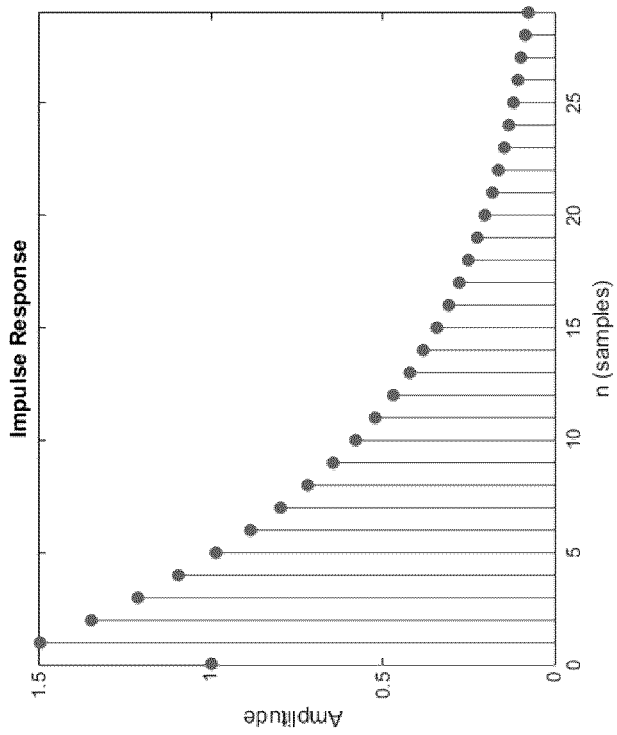
FIG. 10A is an impulse response of the frequency response of FIG. 9.

The impulse response of the acoustic sensor is shown in FIG. 10A. The abscissa denote the coefficients of the impulse response. Per (8) above, we know that the wrapping pattern matches the impulse pattern. In particular, for a given position along the core, a height of the wrapping pattern (defining an amount of optical fiber that is to be wrapped around the core) is a function of a magnitude of a coefficient of the impulse response. It is clear that the shape of the impulse response in FIG. 10A matches a shape of the wrapping pattern shown in FIG. 10B. Thus, as shown in FIG. 10B, an acoustic sensor having the frequency response seen in FIG. 9 is obtained by wrapping optical fiber about a core according to the wrapping pattern shown in FIG. 10B. The y-axis denotes layer number, i.e. the number of layers of optical fiber positioned (e.g. stacked or wrapped on top of each other), while the x-axis denotes distance along the core.

Figure 11:
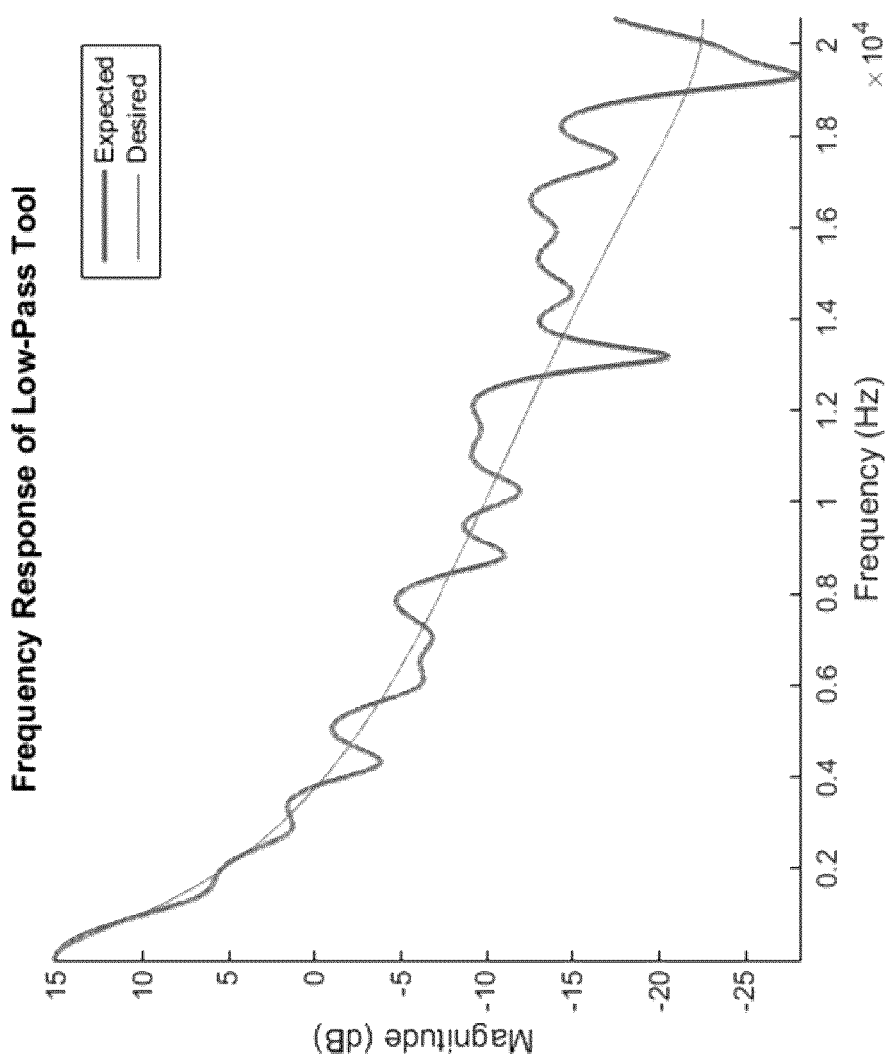
FIG. 11 is a graph contrasting expected and actual frequency responses.

Turning to FIG. 11, there is shown a comparison of the desired frequency response to the expected frequency response of an acoustic sensor wrapped in optical fiber according to the wrapping pattern of FIG. 10B. The slight discrepancy between the desired and expected frequency responses is due to the "quantization" error of the wrapping pattern, since the discrete layer-by-layer wrapping of the optical fiber about the core does not fully replicate a continuous wrapping pattern as seen in FIG. 10B.

Example 2

Figure 12:
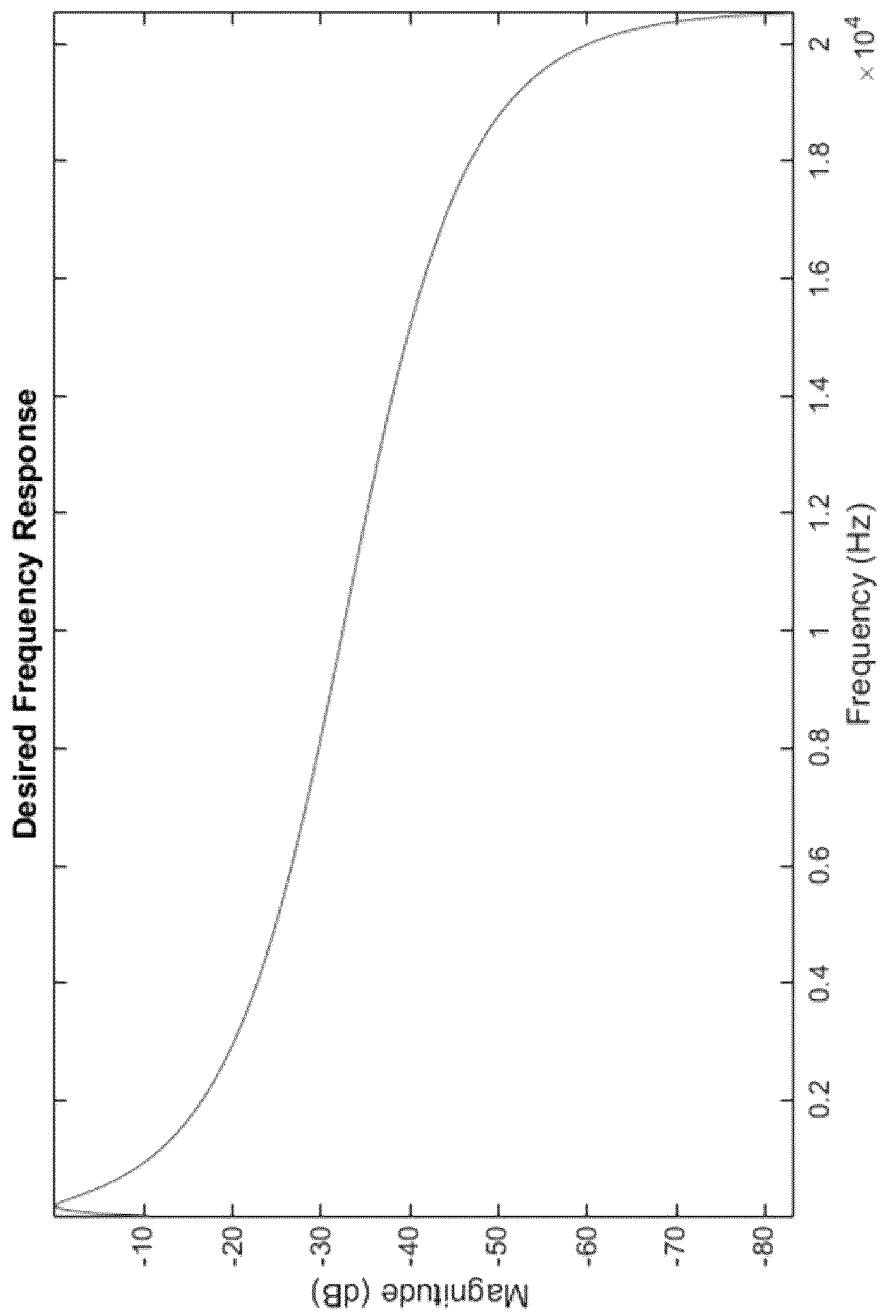
FIG. 12 is a frequency response of a low-pass filter.

Consider the case of an acoustic sensor having a frequency response that approaches that of a low-pass filter, as shown in FIG. 12. In order to determine the wrapping pattern that will allow the acoustic sensor to exhibit such a frequency response, the inverse Fourier transform of the low-pass filter is taken, using the method described above under Example 1. In other embodiments, a Fourier conversion table may be used in order to obtain the impulse response from the desired frequency response.

Figure 13A:
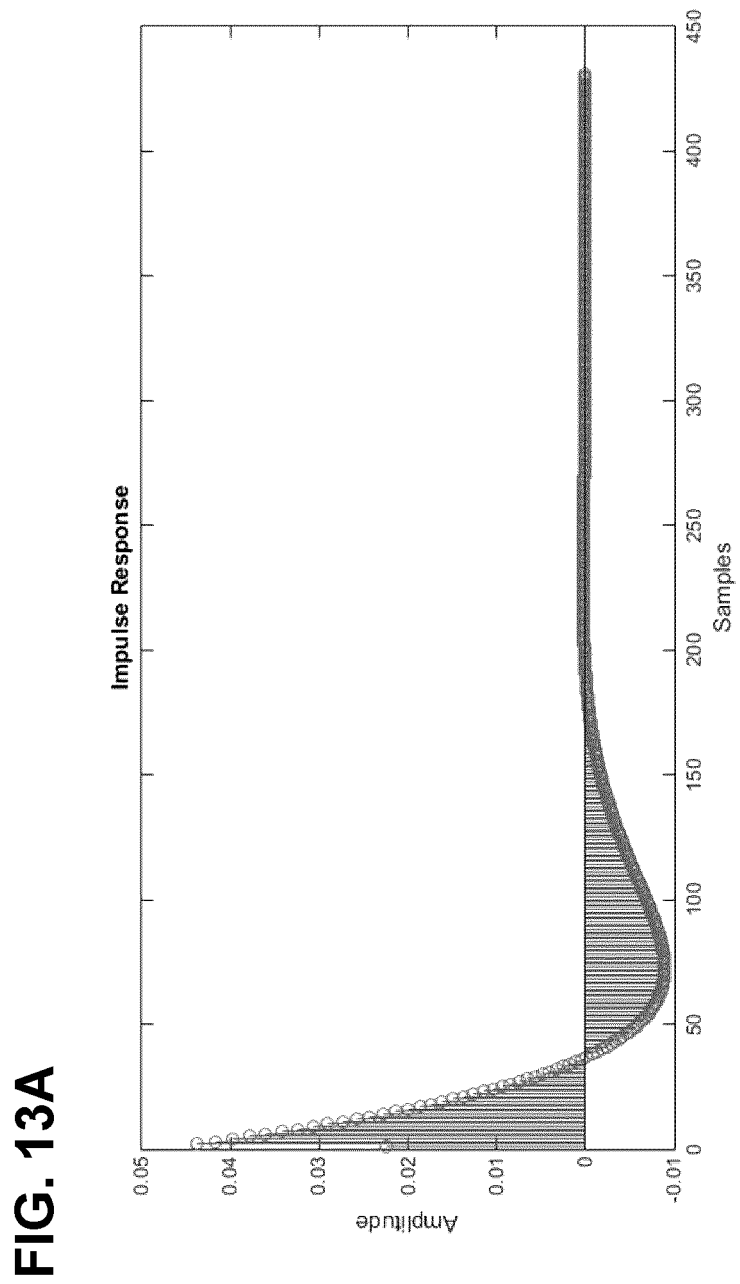
FIG. 13A is an impulse response of the frequency response of FIG. 12.
Figure 13B:
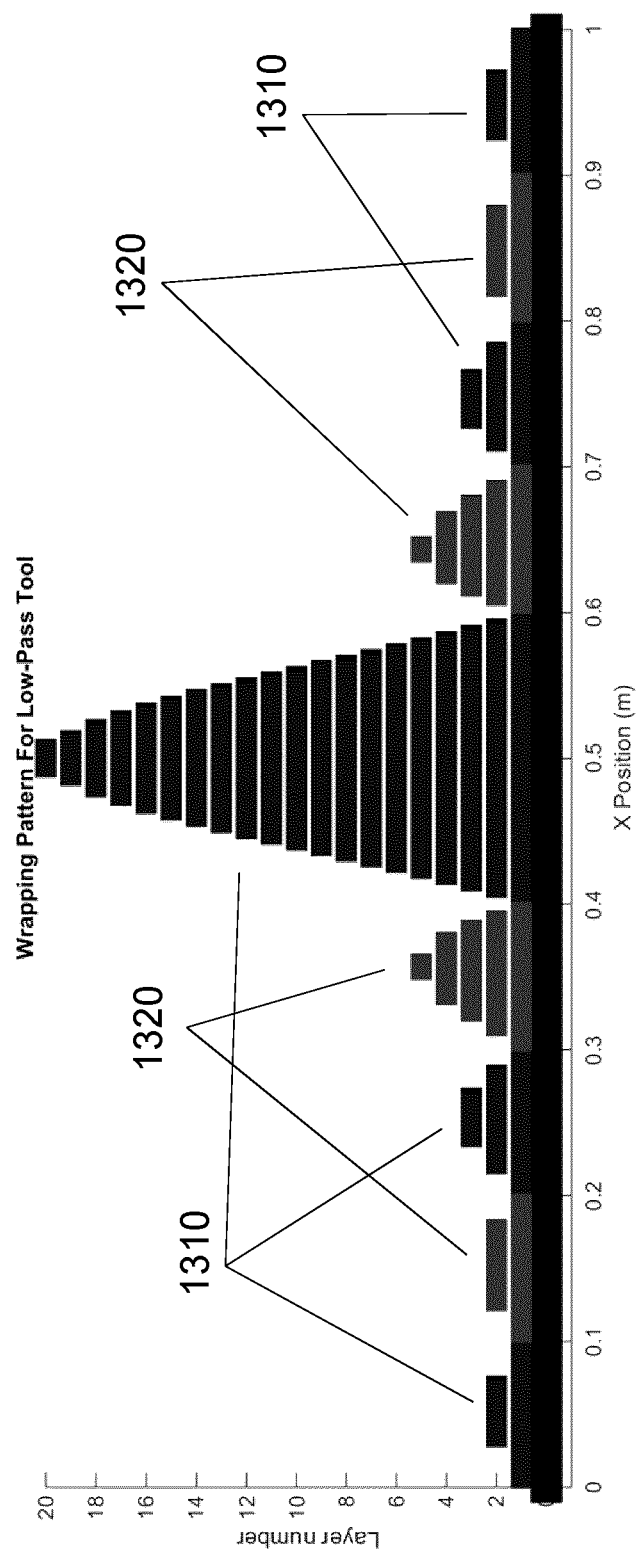
FIG. 13B is a wrapping pattern for achieving the frequency response of FIG. 12.

The impulse response of the acoustic sensor is seen in FIG. 13A. Per (8) above, we know that the wrapping pattern matches the impulse pattern. In particular, for a given position along the core, a height of the wrapping pattern (defining an amount of optical fiber that is to be wrapped around the core) is a function of a magnitude of a coefficient of the impulse response. FIG. 13B shows that a sinc-shaped wrapping pattern is to be used when wrapping optical fiber around the core (note that the wrapping pattern is shown symmetric about the midpoint x=0.5 m of the core). Because a sinc function includes both positive and negative portions, it can be seen that the wrapping pattern in FIG. 13B includes both positive portions 1310 and negative portions 1320. The core is wrapped according to positive portions 1310 using a first optical fiber with an output S1, and is wrapped according to negative portions 1320 using a second optical fiber with an output S2. In order to obtain a low-pass filter frequency response, as desired, the output of the acoustic sensor is determined by subtracting S2 from S1.

Figure 14:
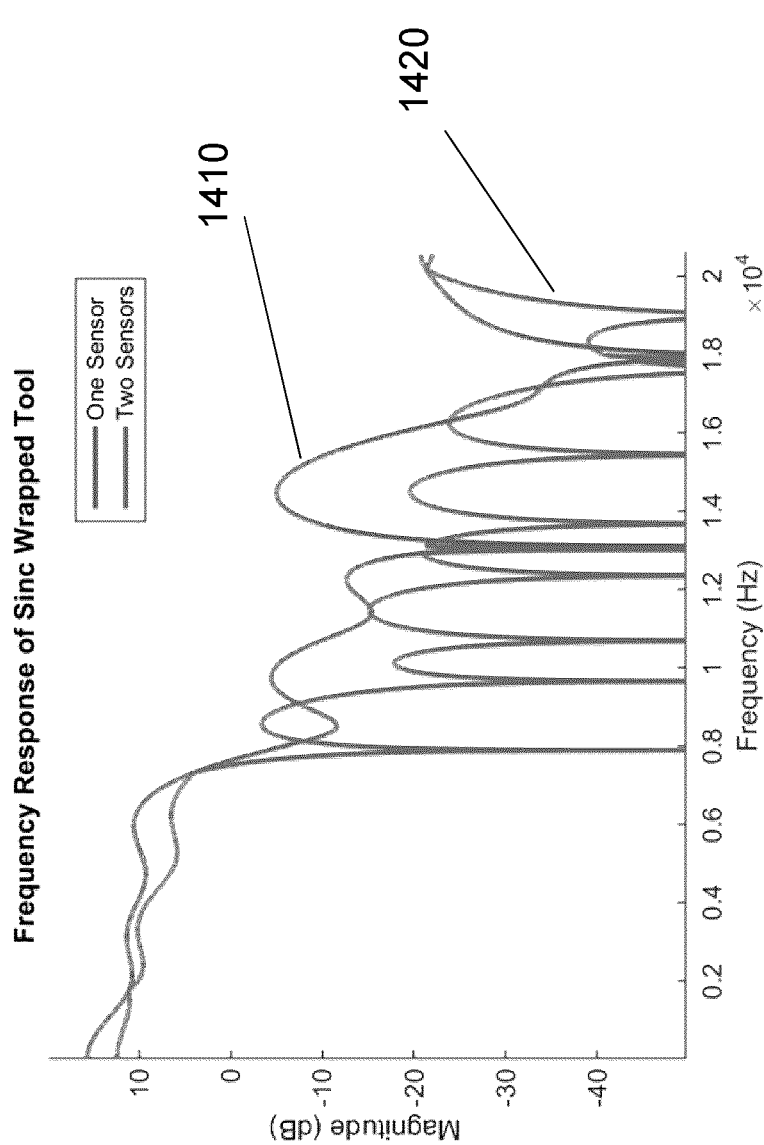
FIG. 14 is a graph contrasting frequency responses obtained with the wrapping pattern of FIG. 13B.

Turning to FIG. 14, there is shown a comparison of two actual frequency responses: frequency response 1410 and frequency response 1420. Frequency response 1410 was obtained when the core was wrapped with only one optical fiber according to positive portions 1310 of the sinc-shaped wrapping pattern shown in FIG. 13B. Frequency response 1420 was obtained when the core was wrapped with two optical fibers with outputs S1 and S2, according to positive portions 1310 and negative portions 1320 of the sinc-shaped wrapping pattern shown in FIG. 13B. As expected, using two optical fibers with outputs S1 and S2 resulted in a better approximation of a low-pass filter, since wrapping the core with two optical fibers, and subtracting the output S2 from the output S1, provided a better approximation of a sinc function.

Example 3

Figure 15:
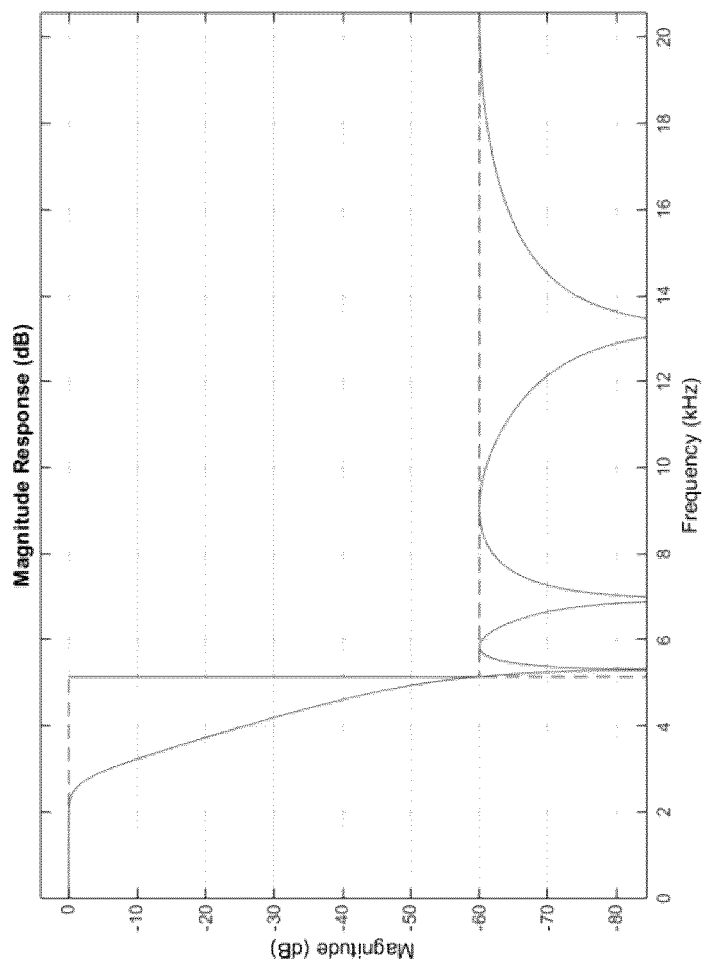
FIG. 15 is a frequency response of a Chebychev Type 2 filter.

Using a sinc-shaped wrapping pattern may not result in an ideal approximation of a low-pass filter. Thus, a wrapping pattern may be determined for an acoustic sensor having the desired frequency response of a Chebychev Type 2 filter (i.e. a frequency response which is substantially constant in the passband region, as seen in FIG. 15). In order to determine the wrapping pattern that will allow the acoustic sensor to exhibit such a frequency response, the inverse Fourier transform of the Chebychev Type 2 filter is taken. The low-pass filter used in the present case is a $6^{th}$ order Chebychev Type 2 low-pass filter with a cut-off frequency of 5139.8 Hz and a sampling frequency of 41118.42 Hz. It is given by the transfer function:

$$F(z) = \frac{0.001 - 0.006z^{-1} + 0.015z^{-2} - 0.02z^{-3} + 0.015z^{-4} - 0.006z^{-5} + 0.001z^{-6} +}{1 - 5.999z^{-1} + 14.996z^{-2} - 19.992z^{-3} + 14.992z^{-4} - 5.996z^{-5} + 0.999z^{-6}}.$$

In order to find the impulse response of this filter, the poles of the filter are determined, the partial fraction expansion is also determined, and then the transform pairs (10) are then used, as explained under Example 1. In other embodiments, a Fourier conversion table may be used in order to obtain the impulse response from the desired frequency response.

Figure 16B:
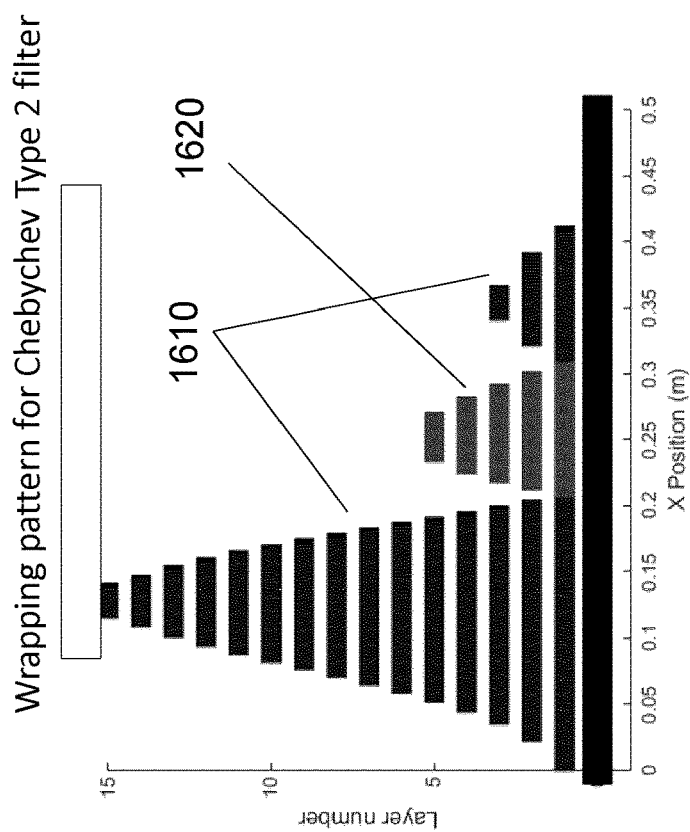
FIG. 16B is a wrapping pattern for achieving the frequency response of FIG. 15.
Figure 16A:
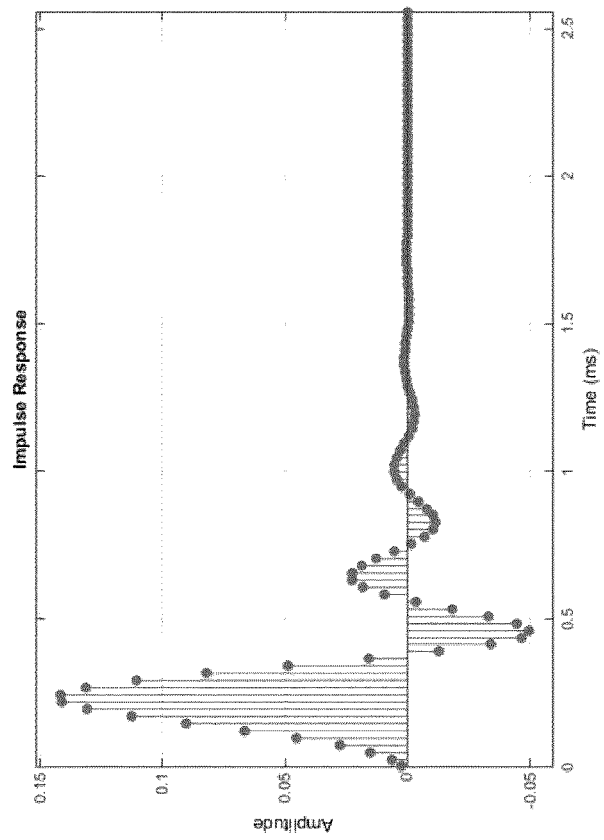
FIG. 16A is an impulse response of the frequency response of FIG. 15.

The impulse response of the acoustic sensor is shown in FIG. 16A. Per (8) above, we know that the wrapping pattern matches the impulse pattern. In particular, for a given position along the core, a height of the wrapping pattern (defining an amount of optical fiber that is to be wrapped around the core) is a function of a magnitude of a coefficient of the impulse response. FIG. 16B shows the wrapping pattern that is to be used when wrapping optical fiber around the core. Similarly to the wrapping pattern of FIG. 13B, the wrapping pattern of FIG. 16B comprises positive portions 1610 and a negative portion 1620. Different optical fibers are wrapped around the core according to positive portions 1610 and negative portion 1620.

Figure 17:
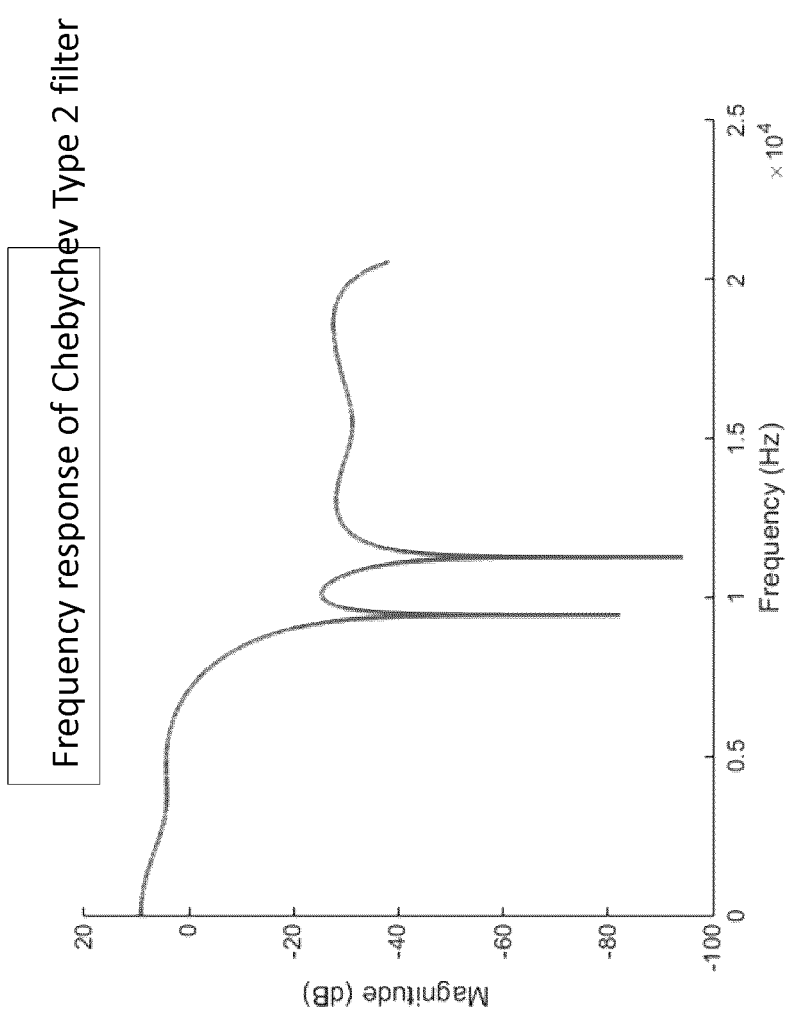
FIG. 17 is a graph showing a frequency response obtained using the wrapping pattern of FIG. 16B.

FIG. 17 shows the actual frequency response of an acoustic sensor formed by wrapping two optical fibers about a core, according to the positive and negative portions of the wrapping pattern of FIG. 16B.

Example 4

Figure 18:
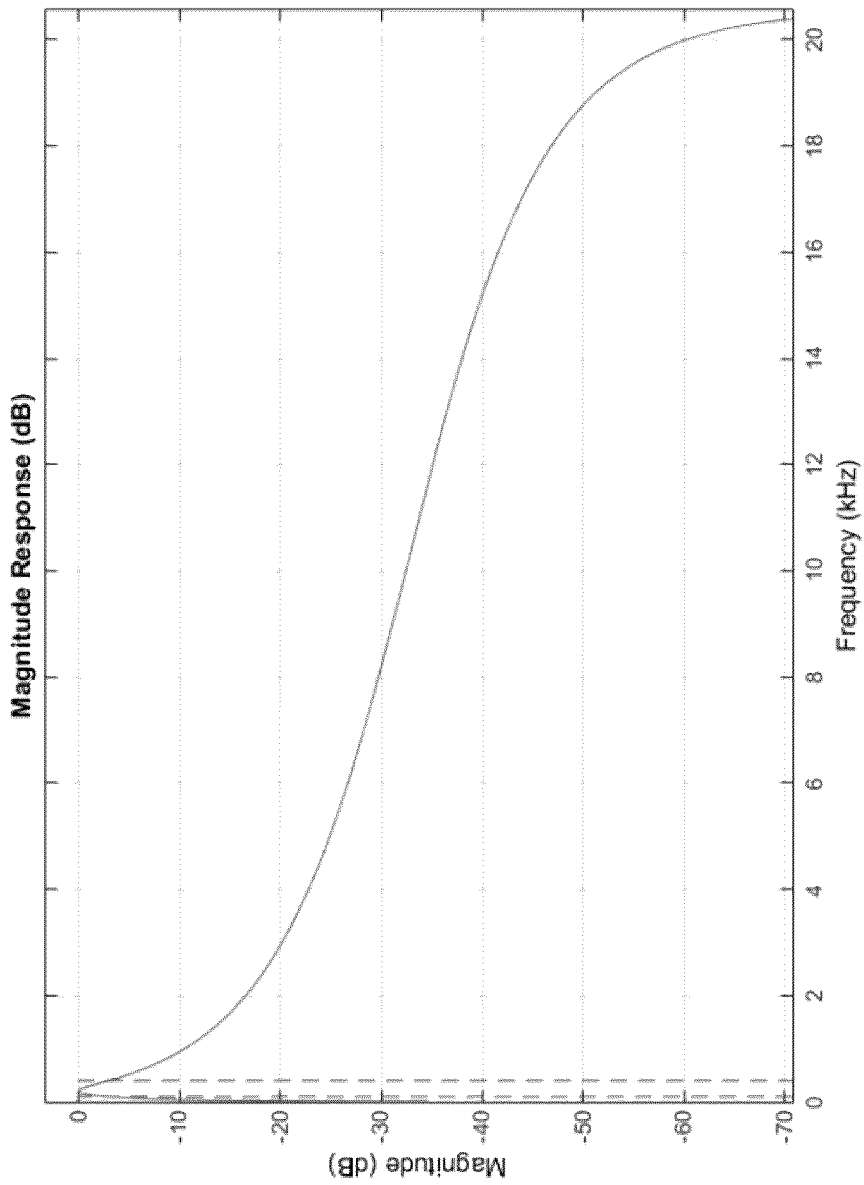
FIG. 18 is a frequency response of a band pass filter.

Consider the case where the desired frequency response is that of a band-pass filter (seen in FIG. 18). In order to determine the wrapping pattern that will allow the acoustic sensor to exhibit such a frequency response, the inverse Fourier transform of the band-pass filter is taken. The band pass filter used in the present case is a $2^{nd}$ order Butterworth filter, with the pass band defined as 100 Hz to 400 Hz, and a sampling rate of 41118.42 Hz. It is given by the transfer function:

$$F(z) = \frac{0.0224 + 0z^{-2} - 0.0224z^{-2}}{1.0000 - 1.9543z^{-1} + 0.9552z^{-2}}.$$

In order to find the impulse response of this filter, the poles of the filter are determined, the partial fraction expansion is also determined, and then the transform pairs (10) are then used, as explained under Example 1. In other embodiments, a Fourier conversion table may be used in order to obtain the impulse response from the desired frequency response.

Figure 19B:
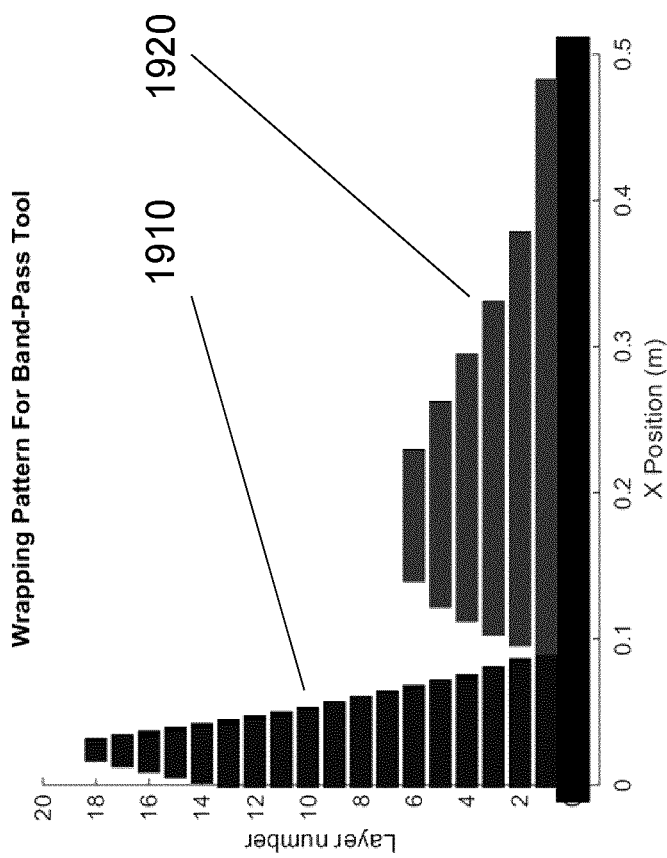
FIG. 19B is a wrapping pattern for achieving the frequency response of FIG. 18.
Figure 19A:
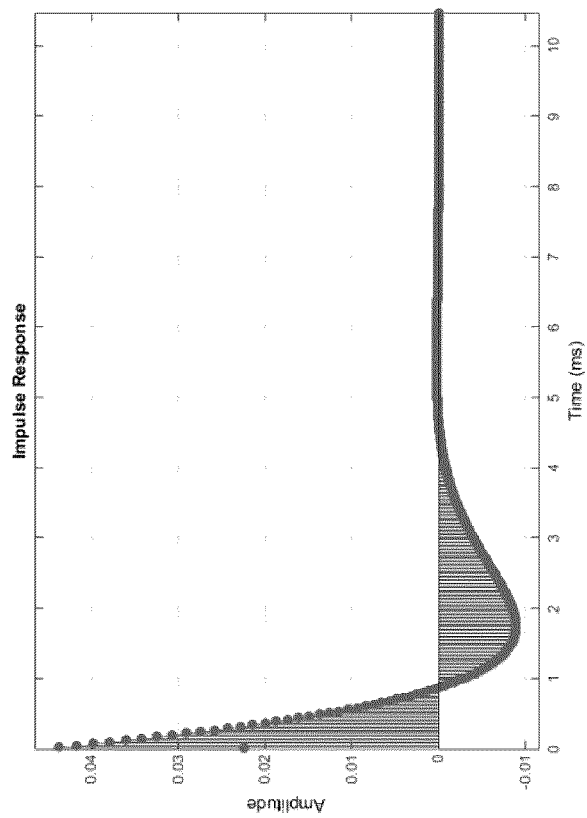
FIG. 19A is an impulse response of the frequency response of FIG. 18.

The impulse response of the acoustic sensor is shown in FIG. 19A. Per (8) above, we know that the wrapping pattern matches the impulse pattern. In particular, for a given position along the core, a height of the wrapping pattern (defining an amount of optical fiber that is to be wrapped around the core) is a function of a magnitude of a coefficient of the impulse response. FIG. 19B shows the wrapping pattern that is to be used when wrapping optical fiber around the core. Similarly to the wrapping patterns of FIGS. 13B and 16B, the wrapping pattern of FIG. 19B comprises a positive portion 1910 and a negative portion 1920. Two optical fibers are wrapped around the core according to positive portion 1910 and negative portion 1920.

Figure 20:
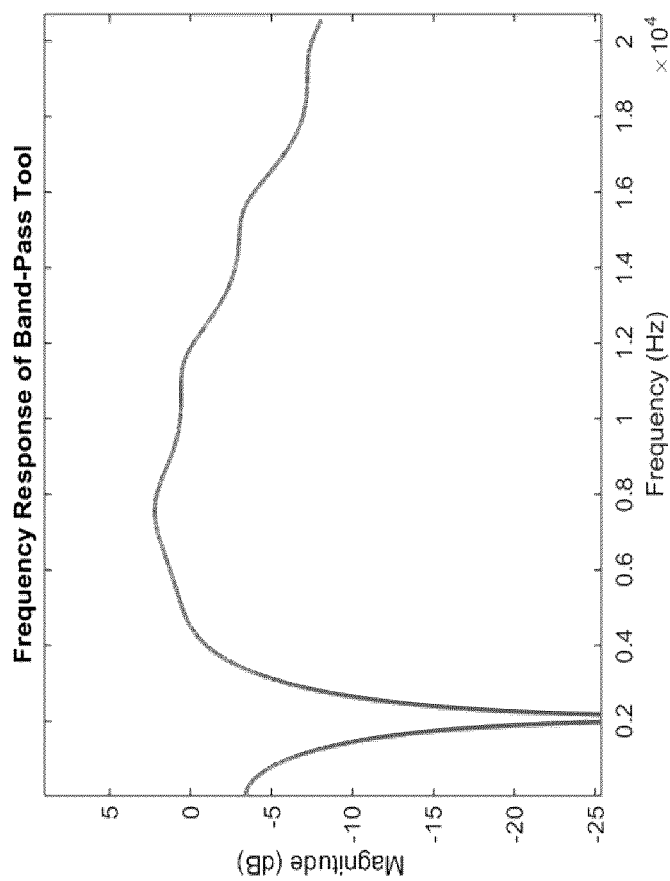
FIG. 20 is a graph showing a frequency response obtained using the wrapping pattern of FIG. 19B.

FIG. 20 shows the actual frequency response of an acoustic sensor formed by wrapping two optical fibers about a core, according to the positive portion and negative portion of the wrapping pattern of FIG. 19B.

One or more example embodiments have been described by way of illustration only. This description has been presented for purposes of illustration and description, but is not intended to be exhaustive or limited to the form disclosed. Many modifications and variations will be apparent to those of ordinary skill in the art without departing from the scope of the claims. It will be apparent to persons skilled in the art that a number of variations and modifications can be made without departing from the scope of the claims. It is furthermore contemplated that any part of any aspect or embodiment discussed in this specification can be implemented or combined with any part of any other aspect or embodiment discussed in this specification.

The invention claimed is:

1. A method of making an acoustic sensor having a frequency response approximating a desired frequency response, comprising wrapping optical fiber around a core according to a wrapping pattern, wherein the wrapping pattern is determined from an impulse response of the acoustic sensor, and wherein the impulse response is determined from the desired frequency response of the acoustic sensor.

2. The method of claim 1, wherein the impulse response is determined by applying an inverse Fourier transform to the desired frequency response.

3. The method of claim 1, wherein, $$A(f) = \left| \mathcal{F}\left[ rect\left(\frac{v}{d}u\right) w\left(vu + \frac{d}{2}\right) \right] \right|,$$

wherein: A(f) is the desired frequency response; F( ) is the Fourier transform function; rect() is a function equal to 1 for all values in the range [−0.5; 0.5], and equal to 0 otherwise; v is the speed of sound; u=(x/v)−(d/2v); x is a distance along the core; d is a length of the core; and w( ) is the wrapping pattern as a function of x.

4. The method of claim 1, wherein the wrapping pattern defines an amount of optical fiber to be wrapped around the core as a function of position along the core.

5. The method of claim 4, wherein the amount of optical fiber comprises a number of layers of optical fiber.

6. The method of claim 4, wherein an amount of optical fiber to be wrapped around the core varies in accordance with a magnitude of coefficients of the impulse response.

7. The method of claim 1, wherein a shape of the wrapping pattern matches a shape of the impulse response.

8. The method of claim 1, wherein the wrapping pattern is determined from a magnitude of coefficients of the impulse response.

9. The method of claim 1, wherein the wrapping pattern is symmetric about a midpoint of the core.

10. The method of claim 1, wherein the impulse response comprises one or more positive portions and one or more negative portions, wherein wrapping optical fiber around the core comprises wrapping a first optical fiber around the core according to the one or more positive portions, and wrapping a second optical fiber around the core according to the one or more negative portions.

11. The method of claim 1, further comprising measuring an output of the acoustic sensor.

12. The method of claim 11, wherein measuring the output comprises subtracting an output of the second optical fiber from an output of the first optical fiber.

13. The method of claim 1, wherein a width of the core varies in accordance with a height of the wrapping pattern.

14. The method of claim 13, wherein the width varies in one or more steps, each step having a height equal to a width of the optical fiber.

15. The method of claim 1, further comprising:
determining the impulse response of the acoustic sensor from the desired frequency response; and
determining the wrapping pattern from the impulse response.

16. An acoustic sensing system comprising:
one or more acoustic sensors, each acoustic sensor being made by wrapping optical fiber around a core according to a wrapping pattern, wherein the wrapping pattern is determined from an impulse response of the acoustic sensor, and wherein the impulse response is determined from a desired frequency response of the acoustic sensor.

17. The acoustic sensing system of claim 16, further comprising a pipeline or a wellbore, and wherein the one or more acoustic sensors are positioned in acoustic proximity to the pipeline or the wellbore.

18. A non-transitory, computer-readable medium having encoded thereon program code configured to cause a computer to execute a method comprising:
determining an impulse response of an acoustic sensor from a desired frequency response; and
determining a wrapping pattern from the impulse response, wherein the wrapping pattern defines a pattern according to which optical fiber is to be wrapped around a core of the acoustic sensor.

19. The non-transitory computer-readable medium of claim 18, wherein, $$A(f) = \left| \mathcal{F}\left[ rect\left(\frac{v}{d}u\right) w\left(vu + \frac{d}{2}\right) \right] \right|,$$

wherein: A(f) is the desired frequency response; F( ) is the Fourier transform function; rect() is a function equal to 1 for all values in the range [−0.5; 0.5], and equal to 0 otherwise; v is the speed of sound; u=(x/v)−(d/2v); x is a distance along the core; d is a length of the core; and w( ) is the wrapping pattern as a function of x.

* * * * *